(12) United States Patent
Lee

(10) Patent No.: US 6,885,055 B2
(45) Date of Patent: Apr. 26, 2005

(54) DOUBLE-GATE FINFET DEVICE AND FABRICATING METHOD THEREOF

(76) Inventor: Jong-Ho Lee, 101-310 Damoa Apt., Wolpyung-dong, Seo-gu, Daejon-city 302-749 (KR)

(*) Notice: Subject to any disclaimer, the term of this patent is extended or adjusted under 35 U.S.C. 154(b) by 0 days.

(21) Appl. No.: 10/358,981

(22) Filed: Feb. 4, 2003

(65) Prior Publication Data

US 2004/0150029 A1 Aug. 5, 2004

(51) Int. Cl.[7] ............................................. H01L 29/72
(52) U.S. Cl. ...................... 257/308; 257/618; 257/619; 257/620
(58) Field of Search ................................ 257/308, 618, 257/619, 620

(56) References Cited

U.S. PATENT DOCUMENTS 6,525,403 B1 * 2/2003 Inaba et al. ................. 257/618

* cited by examiner

*Primary Examiner*—Edward Wojciechowicz
(74) *Attorney, Agent, or Firm*—Sheridan Ross PC

(57) ABSTRACT

The present invention relates to double-gate FinFET devices and fabricating methods thereof. More particularly, the invention relates to an electrically stable double-gate FinFET device and the method of fabrication in which the Fin active region on a bulk silicon substrate where device channel and the body are to be formed has a nano-size width and is connected to the substrate and is formed with the shape of a wall along the channel length direction.

The conventional double-gate MOS devices are fabricated using SOI wafers which are more expensive than bulk silicon wafers. It also has problems including the floating body effects, larger source/drain parasitic resistance, off-current increase, and deterioration in heat transfer to the substrate.

19 Claims, 19 Drawing Sheets

DOUBLE-GATE FINFET DEVICE AND FABRICATING METHOD THEREOF

BACKGROUND OF THE INVENTION

The present invention relates to double-gate FinFET devices and fabricating methods thereof. More particularly, the invention relates to an electrically stable double-gate FinFET device and the method of fabrication in which the Fin active region on a bulk silicon substrate where device channel and the body are to be formed has a nano-size width and is connected to the substrate and is formed with the shape of a wall along the channel length direction (the current flow direction).

Worldwide researches are actively being undertaken in the area of nano-CMOS device technologies since the applications of nano-CMOS technologies in logic circuits and memories have the capability of creating substantial value added revenues.

The system based on the silicon semiconductor technology is becoming smaller and requires low electric power consumption. The size of its devices should be small accordingly.

The most competitive device technology which can meet those requirements is the CMOS device technology.

The gate size of these devices is presently being scaled down, however, some problems are occurring with the scaling-down.

The biggest problem is so called short channel effects. The conventional CMOS devices have mainly fabricated using bulk silicon substrates. The MOS device fabricated on a bulk silicon substrate has device characteristics which are sensitively affected by the fabrication conditions as the length of a gate is being scaled down to a size of less than 50 nm. Also, the device performance of CMOS devices with the channel length around 30 nm is insufficient to be implemented in a real circuit.

A 30 nm CMOS device which is developed by Intel has poor I-V characteristics by considering scaling-down trend of the conventional devices.

There are only small margins for improving the integration density by reducing the actual area occupied by a single device since the spacer region formed at the both sides of a gate has not been scaled down.

Due to the limitation of MOS device technology based on bulk silicon substrates, active researches have been focused on realizing a device with the channel length below 30 nm using Silicon On Insulator (SOI) substrates.

Many research results have been published on analyzing the characteristics of the conventional device structures on a SOI substrate rather than on a bulk substrate, however, the parasitic resistance of the source/drain region due to thin film thickness becomes too large and consequently requires a selective growth of an epitaxial layer in the source/drain region.

Also, the SOI devices, in which the body of a device is not connected to a substrate, have resulted floating body effects and low heat transfer rates, and consequently causing the deterioration in the device performance.

As explained above, the scaling-down characteristic of the conventional device structure implemented on a SOI substrate is not much improved by comparing that of device implanted on a bulk substrate.

A double-gate device structure has emerged as the most appropriate device structure for reducing the channel length of a CMOS device below 25 nm or less.

A double-gate device comprises gate electrodes at the top/bottom or left/right of a channel where the current flows, shows a significant improvement in gate control characteristics of the channel through gate electrodes.

In case where the channel is controlled well by gate bias, the leakage current between a source and a drain can be improved, which leads to the lower Drain Induced Barrier Lowering (DIBL) effect.

Also, due to the presence of gates at the both sides of a channel region, the threshold voltage of the device can be dynamically changed, resulting in much improved on-off channel characteristic in comparison to the conventional single-gate structures and successfully suppressing the short channel effects.

FIG. 1 shows a brief representation of the directions of the current flow in the channel of a double-gate structure formed on the surface of a wafer having a crystal orientation of (100).

A gate 32 is formed at the top/bottom or left/right of a body (channel 34).

FIG. 1a shows a kind of three-dimensional device in which the source/drain region is formed at the top/bottom and the current flows from top to bottom (or vice versa) and a channel 34 is formed at right angles to a (100) wafer.

FIG. 1b shows a standard double-gate MOS device structure in which a channel 34 is formed on the same surface of a (100) wafer and gates 32 are formed at the top and bottom of the channel 34 and the current flows on the surface direction of 100 crystallographic orientation.

FIG. 1c shows a channel 34 which is formed at right angles to the surface of a (100) wafer, and the source/drain region is not formed at the top/bottom of the channel as shown in FIG. 1a. The current flows on both surfaces of the channel (or fin) 34 formed at right angles to the surface of a (100) wafer.

FIG. 2 shows the essential parts of a conventional FinFET structure where the metal layer for wiring was omitted for simplicity.

FIG. 2a and FIG. 2b represent the same structures where FIG. 2a is semi-transparent and FIG. 2b is shaded. Here, the structure and the current flow direction correspond to those of FIG. 1c. The short channel effects can significantly be reduced by forming a gate electrode 16 at both (top/bottom) sides of the channel 34. A silicon substrate 2a of SOI wafer, oxide layers 6, 10 and a gate oxide layer 12 are shown in FIG. 2a.

Hereinafter, the methods of fabricating a double-gate device with the same characteristics as shown in FIG. 1b and FIG. 1c will be described.

First, the key features shown in FIG. 1b will be explained. In FIG. 1b, the current flows to the same horizontal direction as the surface of a (100) wafer. In this structure, the channel 34 is formed on the surface of a (100) wafer like the conventional MOSFETs. Hence, the surface characteristic of Si—SiO2 is not inferior to that of the conventional MOSFETs.

In a double-gate device as shown in FIG. 1b, gates 32 are formed at the top/bottom of a channel 34.

This device structure enables a thin and uniform control of Si film thickness in a silicon body region.

In order to form gates 32 at the top/bottom of a channel 34, wafer bonding process and etch-back process have to be performed by utilizing Micro Electro-Mechanical System (MEMS) technology which makes the fabricating process very complicated.

One of the most important requirements for the double-gate MOS device is that two gates 32 must be self-aligned, otherwise, the device characteristics deteriorate significantly.

A considerable effort has been concentrated on forming a self-aligned gates 32 for the device as shown in FIG. 1b where gates are formed at the top/bottom of a channel 34. Many complications have arisen from the material and complexity of the fabrication process.

In order to improve the scale-down characteristics of the device, the channel silicon film thickness should be reduced to 20 nm or less.

If the silicon film with a thickness of 20 nm or less is used for the channel and source/drain region, the short channel effects could be improved, however, the device characteristics would deteriorate due to a significant increase in source/drain parasitic resistance.

In order to realize both self-alignment and reduction in the source/drain resistance, the complexities of fabrication process should be accepted as a consequence.

Second, the other method of implementing a double-gate MOS device includes forming the gate 32 on both sides of the channel 34 as shown in FIG. 1c is described.

The MOS device in FIG. 1c is called FinFET. In the double-gate device as shown in FIG. 1c, the width of the channel region 34 is patterned to be in a nano-meter size (50 nm or less). The double-gate device uses the etched vertical surfaces on both sidewalls of the body as the main channel regions.

In the above structure, the channel 34 is formed at right angles to the wafer surface.

The fabrication method as shown above has a more simplified fabrication process in comparison to the structure (FIG. 1b) which has gates 32 at the top/bottom.

However, since the channel 34 is formed on the side of the film which is formed at right angle to the surface of a (100) silicon wafer, the crystallographic orientation of the channel becomes 110 and the surface characteristics of the orientation 110 is inferior to that of the conventional 100 surface.

In order to resolve this problem, the body which includes the channel region is formed at 45 degree to the primary flat zone of (100) wafer to form a channel on (100) silicon surface of the body.

The silicon region of the channel is defined by nano-patterning technology. Hence, the device characteristics with the pattern size variation could be relatively large since the variation in size control of the body is larger than that of the double-gate device shown in FIG. 1b where a gate is formed at the top/bottom. Basically, FIG. 1b structure has self-aligned gates which are formed at both sides of the channel 34.

However, the source/drain region formed in thin body region has the same nano-size body width as the channel region and it reduces the current drive capability due to an increase in the source/drain parasitic resistance.

In order to resolve this problem, it was tried to deposit polycrystalline silicon or SiGe layer on the source/drain region as a non-self-aligned manner. However, their impact was not significant since the parasitic resistance between the thin width channel and source/drain region was not reduced in spite of the new fabrication methods that were either being added or altered.

Thus, a double-gate MOS device formed on a conventional SOI silicon substrate is more expensive than that on a bulk wafer. It also has a larger the source/drain parasitic resistance.

Like a floating body SOI devices, the body 34 where a channel is formed as shown in FIG. 2 is not connected to the SOI silicon substrate 2a, hence, the floating body problem may be arisen. Also, since an oxide film 10 on a SOI silicon substrate 2a which is blocking the heat, which is generated by the device, being transferred to the SOI silicon substrate 2a, the device characteristic deteriorates.

SUMMARY OF THE INVENTION

The object of the present invention is to provide a double-gate FinFET device and the method of fabricating thereof in which a bulk silicon wafer is utilized in order to reduce the wafer cost, and source/drain parasitic resistance by forming an epitaxial layer which is self-aligned to a gate is reduced, the channel, source/drain, and the body are formed in Fin active region, and by being the body connected to a bulk silicon substrate the floating body problem is resolved and the device characteristics could be improved by increasing the heat transfer rate.

A double-gate FinFET device according to the present invention comprises a bulk silicon substrate, a Fin active region which is formed as a wall-shape single crystalline silicon on the surface of the bulk silicon substrate and connected to the bulk silicon substrate, a second oxide layer which is formed up to a certain height of the Fin active region from the surface of bulk silicon substrate, a gate oxide layer which is formed at both side-walls of the Fin active region protruded from the second oxide layer, a first oxide layer which is formed on the upper surface of the Fin active region with a thickness greater or equal to that of the gate oxide, a gate which is formed on the first and second oxide layer, source/drain regions which are formed on both sides of the Fin active region except where the gate overlaps with the Fin active region, and contact regions and a metal layer which are formed at the source/drain and gate contact regions.

A double-gate FinFET device fabrication method according to the present invention comprises the steps of forming a wall-shape Fin active region which consists of single crystalline silicon on a bulk silicon substrate, forming a second oxide layer up to a certain height of the Fin active region from the surface of bulk silicon substrate, forming a gate oxide layer at both side-walls of the Fin active region protruded from the second oxide layer, forming a first oxide layer on the upper surface of the Fin active region with a thickness greater or equal to that of the gate oxide, forming a gate on the first and second oxide layer, forming source/drain regions on both sides of the Fin active region except where the gate overlaps with the Fin active region, and forming contact regions and a metal layer at the source/drain and gate contact regions.

BRIEF DESCRIPTION OF THE DRAWINGS

FIG. 4a is perspective view of FIG. 3a and FIG. 4b is plan view which shows the layout patterns of FIG. 3a.

DETAILED DESCRIPTION OF THE EMBODIMENTS

Figure 1A:
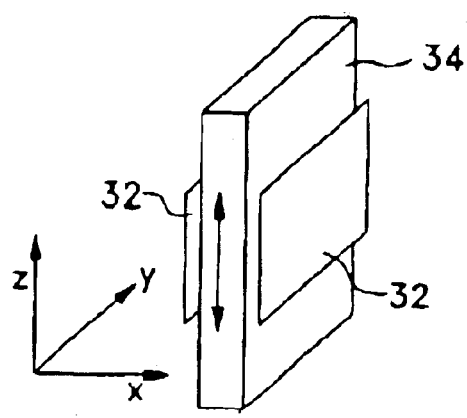
FIG. 1a through FIG. 1c is a perspective view which shows brief representations of the directions of the current flow in the channel of a double-gate structure formed on the surface of a wafer having a crystal orientation of (100).
Figure 1B:
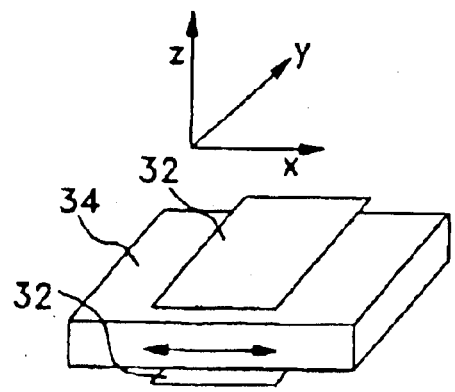
Figure 1C:
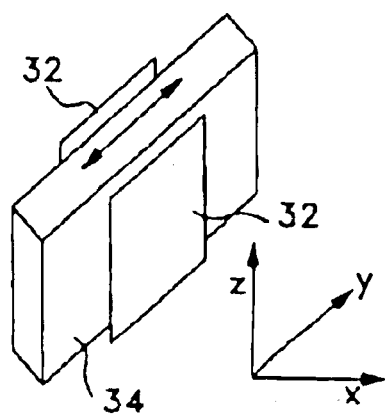

Hereinafter, preferred embodiments of the present invention will be described in detail with reference to the accompanying drawings.

First of all, the present invention comprises a bulk silicon substrate 2b and a Fin active region 4 which consists of single crystalline silicon with the shape of a wall on the surface of the bulk silicon substrate 2b and is connected to the bulk silicon substrate 2b, a second oxide layer 10 which is formed to a certain height above the Fin active region 4 from the surface of the bulk silicon substrate 2b, a gate oxide layer 12 which is formed at both side-walls of the Fin active region 4 protruded from the second oxide layer 10, a first oxide layer 6 which is formed on the upper surface of the Fin active region 4 with a thickness that is greater or equal to the thickness of the gate oxide 12, a gate 16 which is formed on the first oxide layer 6 and second oxide layer 10, a source/drain region which is formed on both sides of the Fin active region 4 except where the gate 16 overlaps with the Fin active region 4 and contact regions 46 and a metal layer 48 which are formed at the source/drain and gate 16 contact regions.

From the above construction, the thickness of the second oxide layer 10 is selected in a range from 20 nm to 800 nm in order to reduce the parasitic capacitance between the gate 16 and bulk silicon substrate 2b.

From the above construction, the integration of a device can be improved and the contact resistance can be reduced by constructing the size of the contact region 46, which is in contact with said metal layer 48, wider than the width of the Fin active region and longer than the length of the gate 16.

From the above construction, the resistance of Fin active region can be reduced by not fixing the width of the Fin active region 4 but gradually increase the width within the second oxide layer 10 as it approached to the bulk silicon substrate 2b.

From the above construction, the shape of the Fin active region 4 can be a trapezoid where the width of the upper section is narrow and the lower section is wide.

From the above construction, the two top corners of the Fin active region 4 can be chamfered through an oxidation above 900° C. and etching, and (or) annealing process in a hydrogen atmosphere in order to improve the durability of the device.

From the above construction, the gate material 16 can be one of poly-silicon, poly-SiGe, and metal.

Figure 3A:
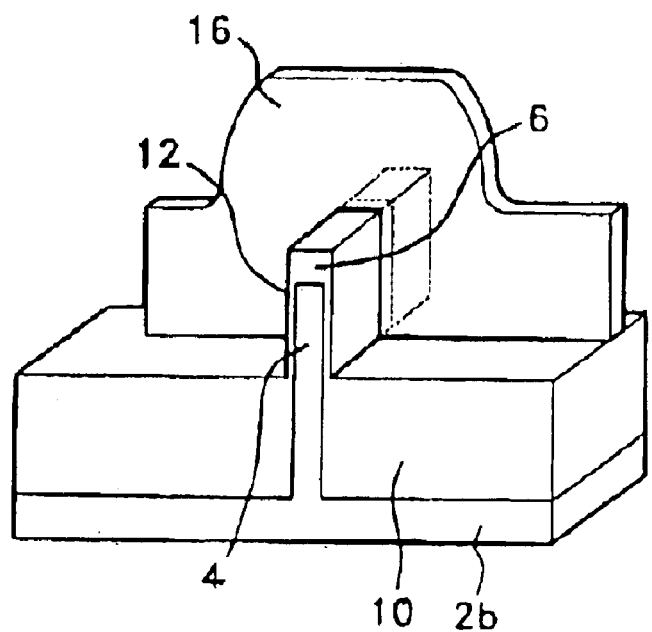
FIG. 3a and FIG. 3b are perspective views which show the structure of a Fin FET device according to the present invention which are represented by semi-transparent and shaded, respectively.
Figure 3B:
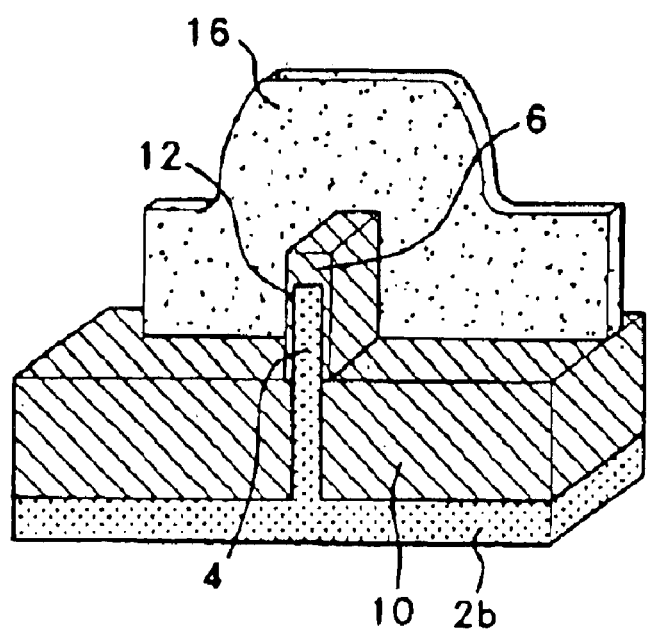

FIG. 3 shows the device structure according to the present invention. It shows the essential parts of a conventional FinFET structure where a metal layer for wiring is omitted. FIG. 3a and FIG. 3b are the same structure and show semi-transparent and shaded views, respectively.

Figure 2A:
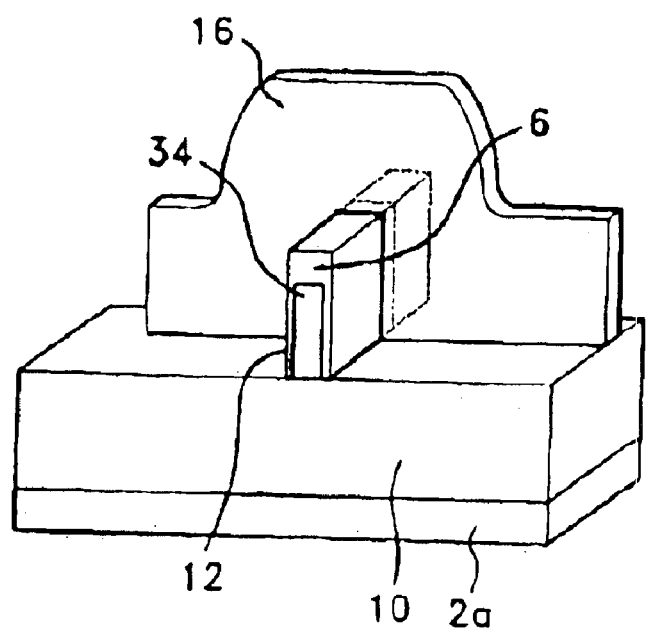
FIG. 2a and FIG. 2b are perspective views which show the conventional structure of a Fin FET device which are represented by semi-transparent and shaded, respectively.
Figure 2B:
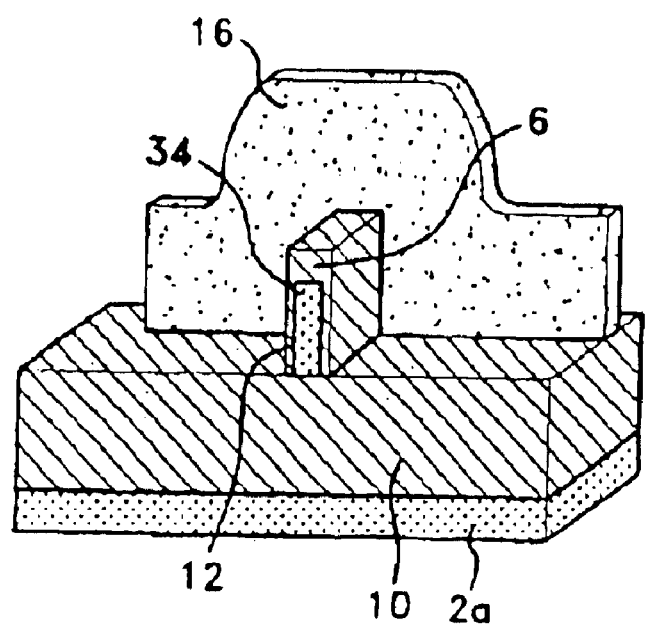

Unlike FIG. 2, the Fin active region 4 is not floating and is connected to the bulk silicon substrate, as a result, the device characteristics can be much improved.

More specifically, the floating body problem which exists for the device formed on the conventional SOI silicon substrate 2a can be removed by connecting the body to the silicon substrate. Also, the heat generated by the channel region of a device can transfer to the bulk silicon substrate 2b more efficiently than the conventional SOI structure.

Also, it has a cost advantage since the device is fabricated on a bulk wafer rather than a SOI wafer.

Figure 4A:
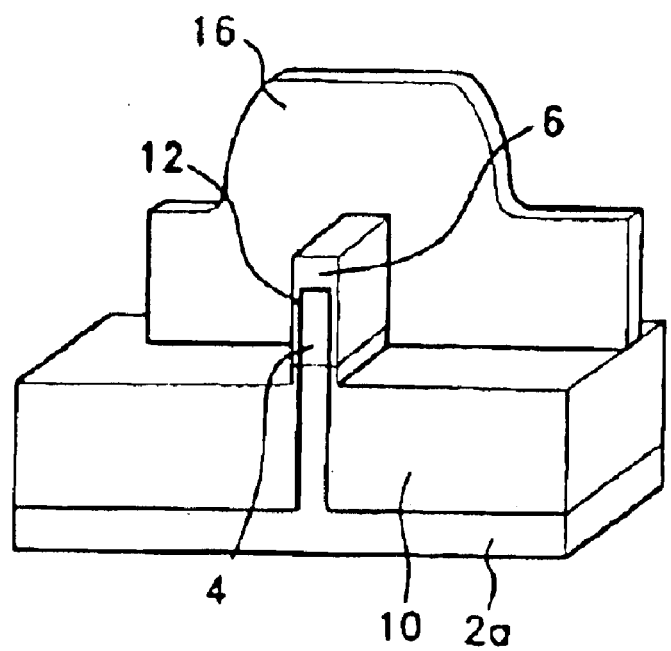
Figure 5A:
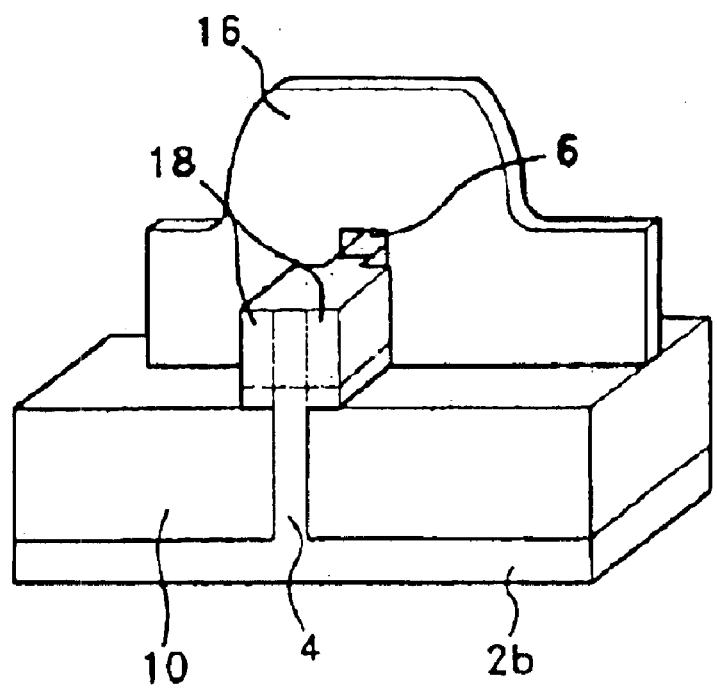
FIG. 5a and FIG. 5b are perspective and plane views which show the structure of a Fin FET device according to one embodiment of the present invention.

FIG. 4a is the device structure according to one preferred embodiment of the present invention. It is identical to FIG. 3a and is added for comparison. In FIG. 5a, a selective epitaxial layer 18 is added to the structure in FIG. 4a in order to reduce the source/drain parasitic resistance.

Figure 4B:
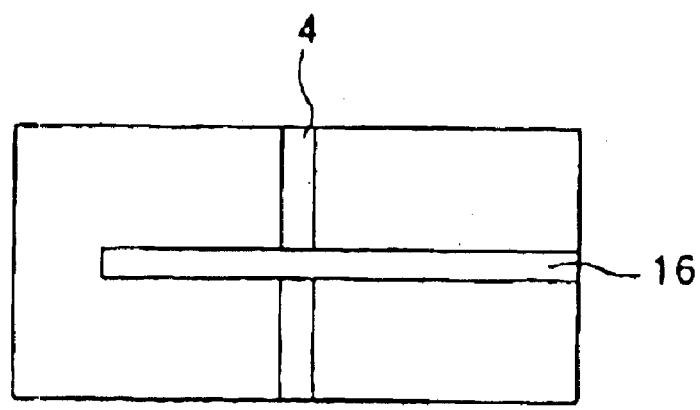
Figure 5B:
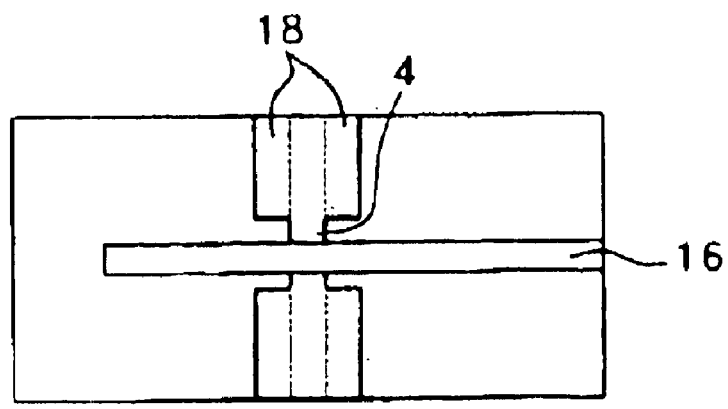

FIG. 4a and FIG. 5a show the essential parts except the metal layer for wiring and FIG. 4b and FIG. 5b are the top views of FIG. 4a and FIG. 5a, respectively.

In FIG. 4b, a source/drain region is formed on the region where the gate 16 does not overlap with the Fin active region 4.

A contact is formed at the area where the source/drain is constructed in the Fin active region 4. Since a metal wire is connected to a Fin structure which is exposed by contact open process and the Fin width is identical to that of the thin channel, it can significantly increase the source/drain parasitic resistance. Hence, the parasitic resistance can be reduced through the method as shown in FIG. 5b.

Hereafter, the process of growing a selective epitaxial layer 18 in the source drain region of Fin FET device will be described.

It is assumed that the device has been fabricated up to the gate structure 16.

If the sample with the polysilicon gate doping of above $10^{20}$ cm$^{-3}$ and the channel doping of around $10^{18}$ cm$^{-3}$ is oxidized in wet ambient with the thickness between 5 nm and 20 nm, then a 3 to 5 times thicker oxide can grow on the gate due to the doping.

If the above grown oxidation layer is etched again with respect to the thickness of the oxide grown on the exposed Fin channel region, the oxide layer formed on the side-walls of the Fin active region is removed and the silicon in the Fin active region 4 is exposed.

At this time, the gate 16 is still covered with a relatively thick oxide layer. Taking the silicon, which is exposed at the side-walls of the Fin active region 4 of the source/drain, as a seed, a selective epitaxial layer 18 is grown.

In some cases, the silicon at the side-walls as well as the upper section of the Fin active region 4 is exposed and this is taken as a seed in order to grow a selective epitaxial layer 18.

The selective epitaxial layer 18 that can be grown in this instance is one of single crystalline silicon, single crystalline SiGe, single crystalline Ge, polysilicon, and poly SiGe.

The dash dot line in the Fin active region 4 as shown in FIG. 4a and FIG. 5a represents the depth of the source/drain junction.

In FIG. 4a and FIG. 5a, for example, the junction depth is located slightly above the surface of the second oxidation layer 10. It is possible to control the short channel effects by controlling the junction depth.

When the upper surface of the second oxidation layer 10 is taken as a reference line, the junction depth should be lie in a range which is greater than 0 nm and less than 50 nm above the reference line in order to suppress the short channel effects.

On the contrary, if the range is less than 0 nm and greater than −50 nm then the current driving capability is improved rather than suppressing the short channel effects.

FIG. 5a shows the selective epitaxial layer 18 according to another preferred embodiment of the present invention.

According to the fabrication process, after a gate 16 is formed, a dielectric layer with thickness between 5 nm and 100 nm is deposited, and an anisotropic etching is carried out for a thickness corresponding to the deposition thickness and the height of the Fin active region 4 protruding above the second oxidation layer 10, the dielectric layer is formed only in the vicinity where the gate 16 comes into contact with source/drain Fin active region 4.

Taking the silicon region of the exposed Fin active region and poly-silicon region as seeds, a selective epitaxial layer 18 is grown by a thickness between 5 nm and 100 nm.

Hence, the selective epitaxial layer 18 is grown on the source/drain region as well as on the poly-silicon or SiGe gate 16 resulting in a reduction in the resistance.

The gate 16 and source/drain are electrically insulated.

FIG. 6 shows a masking sequence in order to implement the structure as shown in FIG. 4a.

Figure 6A:
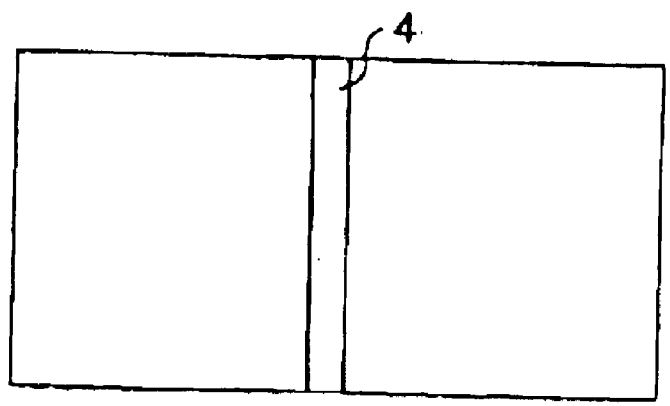
FIG. 6a through FIG. 6d are plan views which show each masking step in order to implement the device shown in FIG. 4.
Figure 6B:
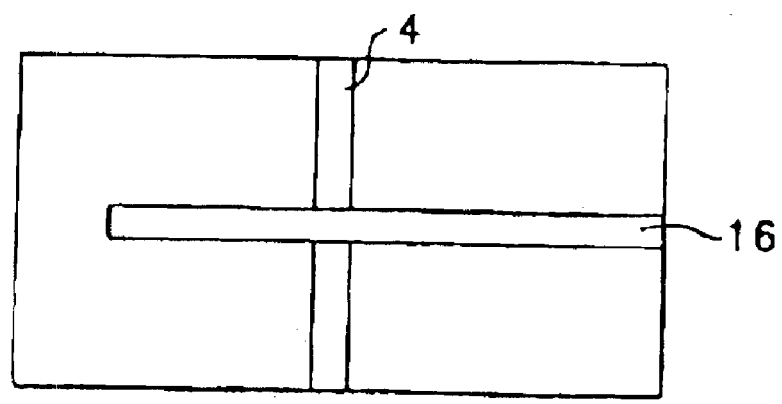

FIG. 6a is for implementing a Fin active region 4 and FIG. 6b is for implementing a gate 16.

Figure 6C:
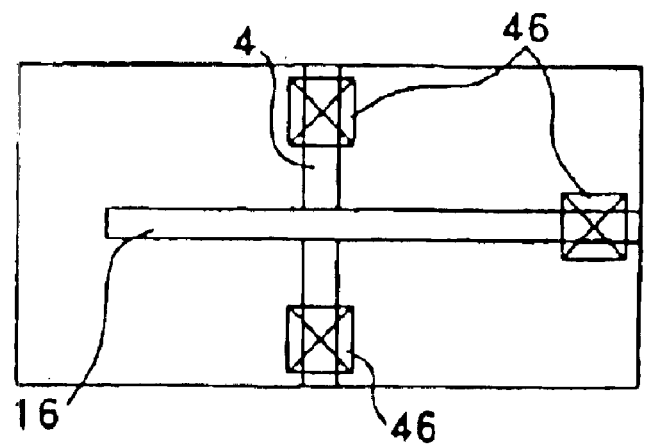
Figure 6D:
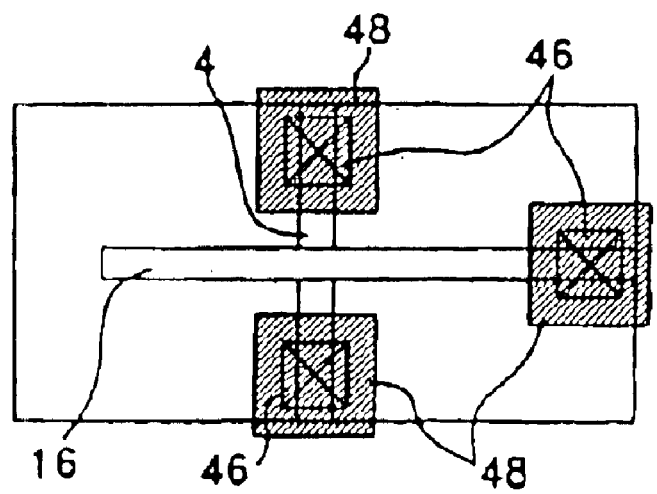

FIG. 6c shows contact regions 46 for the source/drain contact and FIG. 6d shows the connection of a metal layer 48 for wiring.

Figure 7:
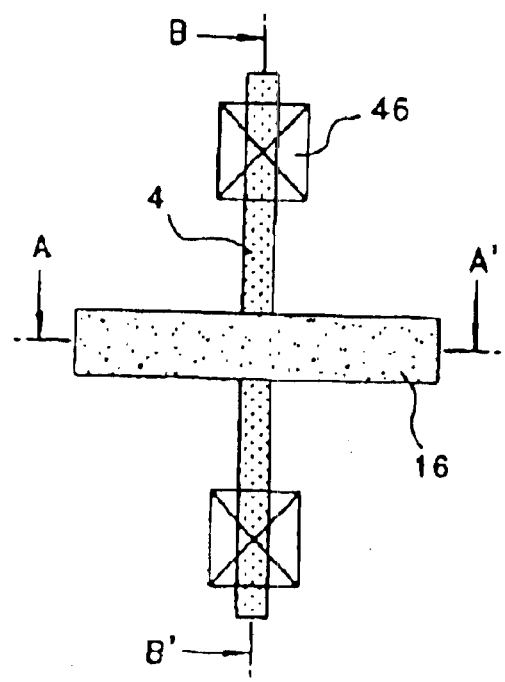
FIG. 7 shows cross sections in the horizontal and perpendicular directions of the structure according to the present invention as shown in FIG. 4.
Figure 7:
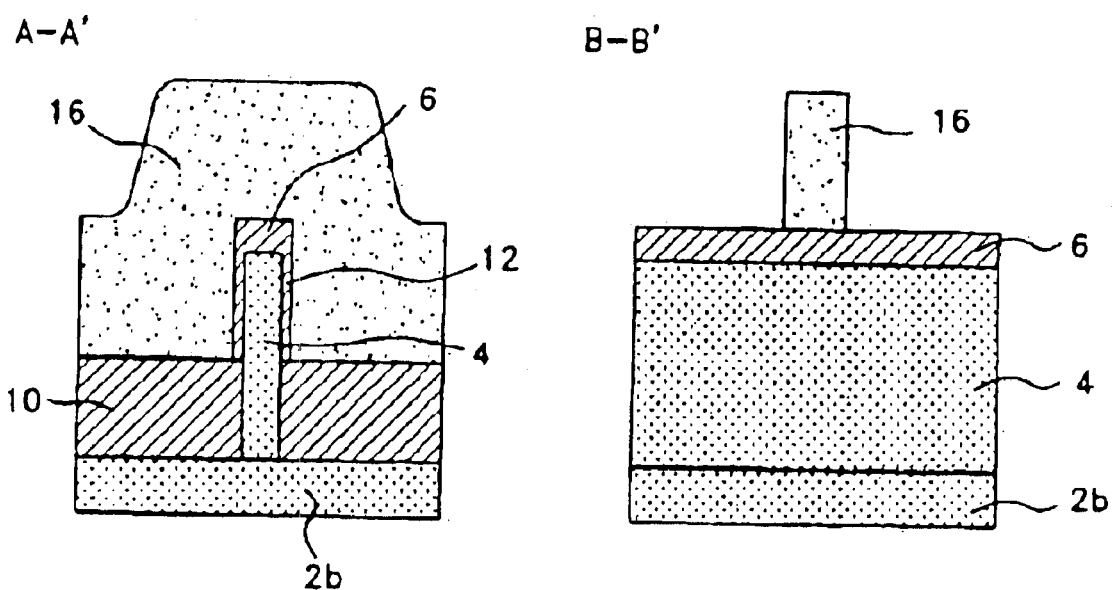

FIG. 7 shows cross sections in the horizontal and perpendicular directions of the structure according to the present invention as shown in FIG. 4.

The resistance of the source/drain region is large since its width is nearly same as that of the narrow Fin active region 4.

The contact regions 46 are utilized for electrically connecting a metal layer 48 with the source/drain formed in the Fin active region 4.

Figure 8:
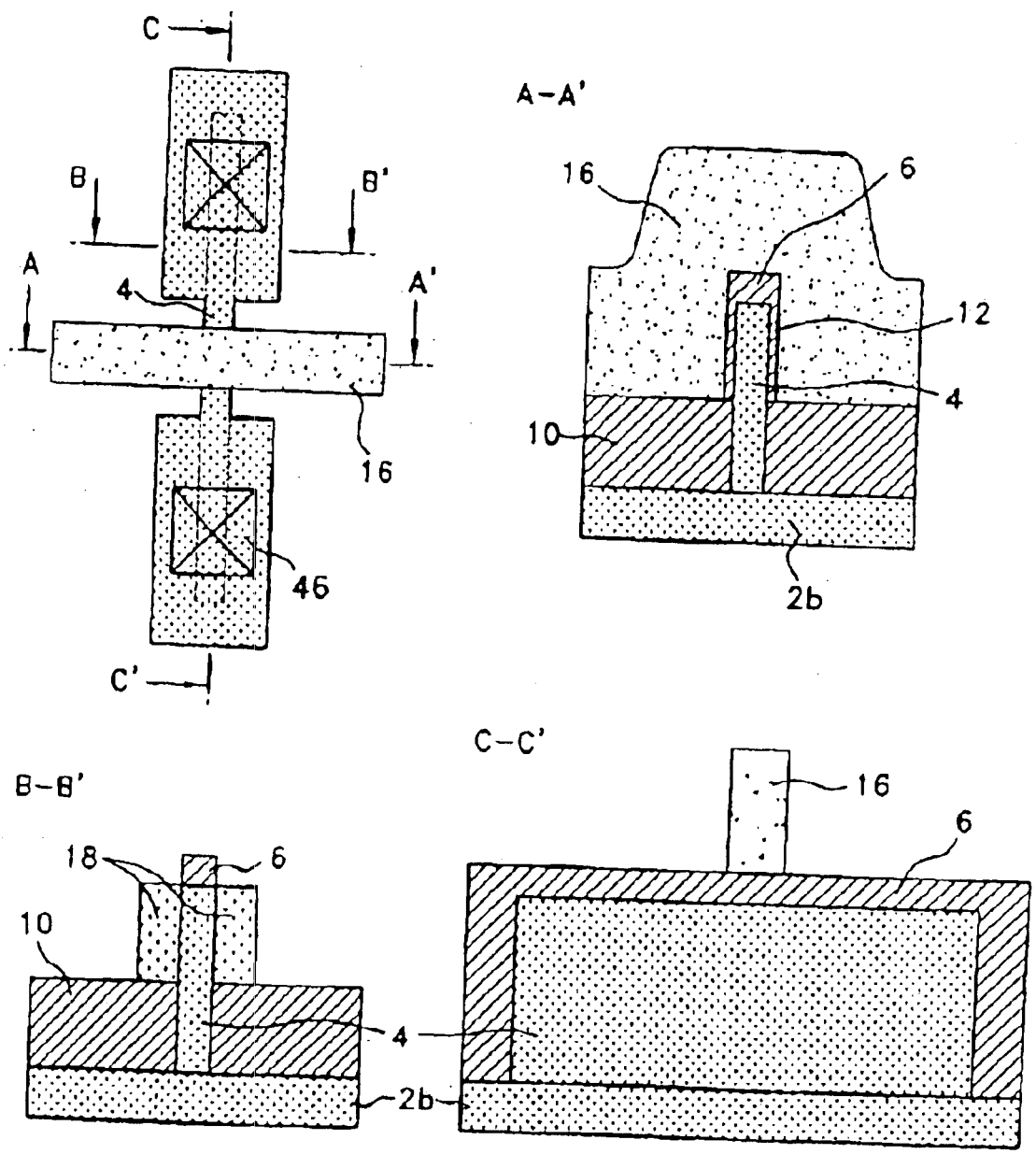
FIG. 8 shows cross sections in the horizontal and perpendicular directions of the structure according to the present invention as shown in FIG. 5.

FIG. 8 shows cross sections in the horizontal and perpendicular directions of a structure where a selective epitaxial layer 18 is grown on the source/drain Fin active region 4 according to the present invention as shown in FIG. 5.

As can be seen from the added cross section (B–B' cross section) at the lower left section, a selective epitaxial layer 18 is formed on both side-walls exposed in the Fin active region 4.

The selective epitaxial layer 18 can be grown on the both side-walls as well as the upper section in the Fin active region 4.

The source/drain region has a small parasitic resistance value since it has a wider width from the growth of the epitaxial layer 18.

The contact regions 46 are utilized for electrically connecting a metal layer 48 with the source/drain formed in the Fin active region 4.

Hereinafter, in order to show the body of the proposed structure in the present invention, a two dimensional cross section is used for showing the essential contact between the channel and the gate 16 instead of a three dimensional cross section.

FIG. 9 is an example for implementing the FinFET device according to the present invention. A two dimensional cross section for fabricating the structure using Chemical Mechanical Polishing (CMP).

Figure 9A:
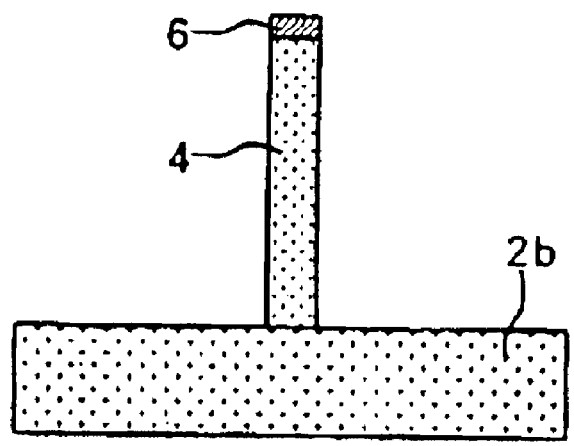
FIG. 9a through FIG. 9d show key steps to implement the body structure of the FinFET device according to the first embodiment of the present invention.

FIG. 9a shows the process which forms a first oxide layer 6 on a bulk silicon substrate 2b, carries out a nano-patterning process and the first oxide layer 6 and the silicon of the bulk silicon substrate 2b are etched.

Later, the Fin active region 4 that is connected to the bulk silicon substrate 2b is formed.

At this instance, the thickness of the first oxide layer 6 is in a range between 0.5 nm and 200 nm, the height of Fin active region 4 is in a range between 10 nm and 1000 nm and the width is in a range between 4 nm and 100 nm.

Figure 9B:
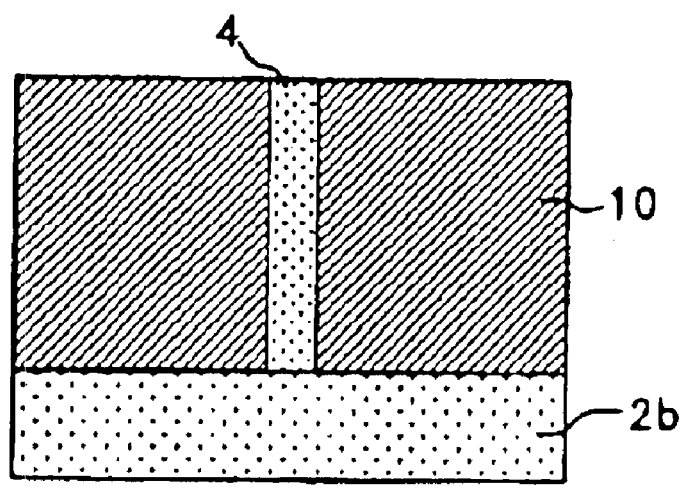

FIG. 9b shows an etched cross section by CMP after forming a second oxide layer 10 on the structure in FIG. 9a with a thickness between 20 nm and 1000 nm, or preferably between 20 nm and 800 nm.

Figure 9C:
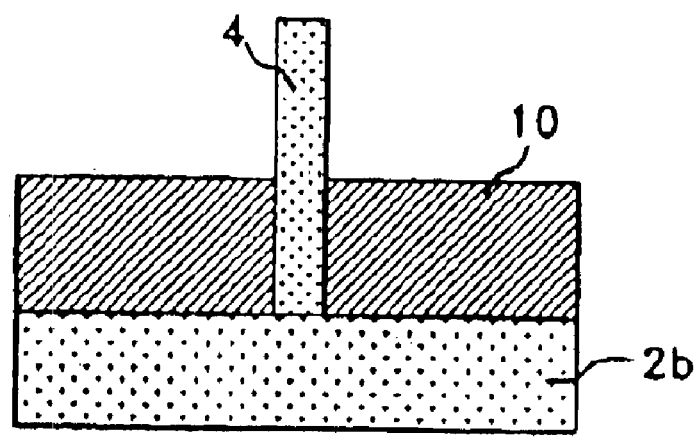

FIG. 9c shows a cross section after removing a second oxide layer 10 on the structure in FIG. 9b by a thickness between 10 nm and 300 nm from the surface.

Eventually, the height of the Fin active region 4 protruding above the second oxide layer 10 is between 5 nm and 300 nm.

Figure 9D:
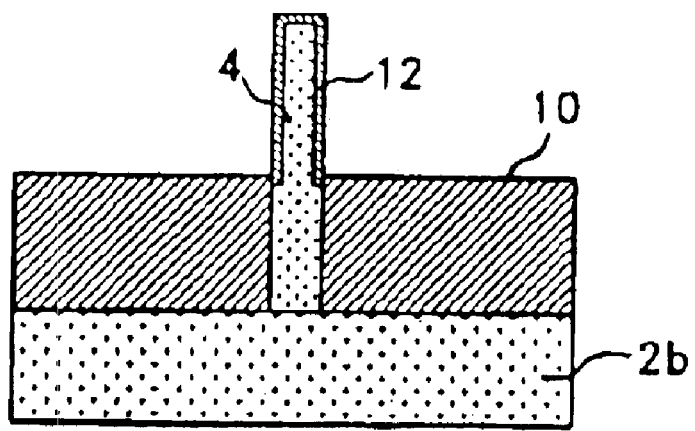

FIG. 9d shows a cross section after growing a gate oxide layer 12 with a thickness between 0.5 nm and 10 nm in the formed Fin active region 4.

It is more preferable to clean the side-walls of the protruding Fin active region 4 before growing the gate oxide layer 12 and to carry out an annealing process in a Nitrogen or Argon atmosphere after removing a sacrificial oxide layer, which is grown to remove the damage generated during the previous process.

As a post process, a gate electrode is formed using one of gate materials such as poly-silicon (P+ or N+ doping), SiGe (P+ or N+ doping), and metals, and the gate 16 is defined by using photolithography.

An oxide layer is formed, and an appropriate heat treatment process is carried out, and if necessary, a layer of oxide is deposited.

Afterwards, a photolithography process is carried out for forming a contact region 46.

A metal layer 48 is deposited to be electrically connected with the source/drain and a metal wiring is formed through a photolithography process.

FIG. 10 is an example for implementing the body where the channel of the FinFET device is formed according to the present invention. It shows the essential processing steps for fabricating the structure using Chemical Mechanical Polishing (CMP).

Figure 10A:
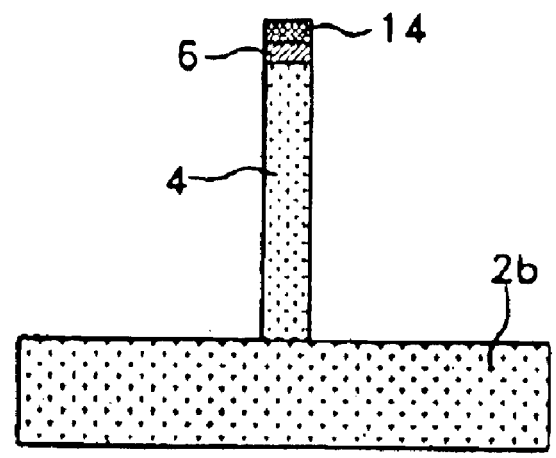
FIG. 10a through FIG. 10d show key steps to implement the body structure of the FinFET device according to the second embodiment of the present invention.

FIG. 10a shows the process of forming a first oxide layer 6 and a nitride layer 14 on a bulk silicon substrate 2b and carrying out a nano-patterning, and etching the first oxide layer 6, nitride layer 14, and the silicon of the bulk silicon substrate 2b.

The above nitride layer 14 is used as an etch stopper for CMP and the thickness is between 10 nm and 200 nm.

Later, a Fin active region 4 which is connected to the bulk silicon substrate 2b is formed.

At this instance, the thickness value of the first oxide layer 6 is between 0.5 nm and 200 nm and the height of Fin active region 4 is between 10 nm and 1000 nm.

Figure 10B:
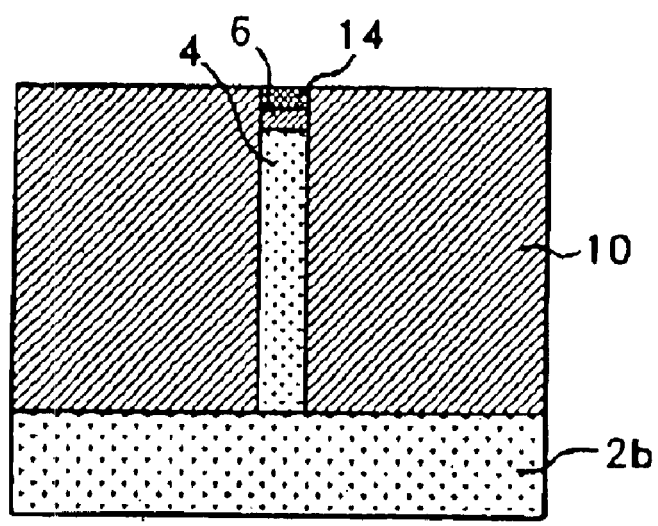

FIG. 10b shows a cross section etched by CMP after forming a second oxide layer 10 on the structure in FIG. 10a with a thickness between 20 nm and 1000 nm, or preferably between 20 nm and 800 nm.

Figure 10C:
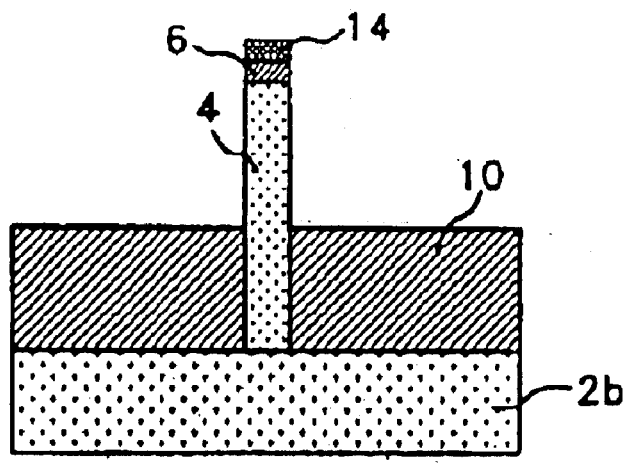

FIG. 10c shows a cross section after removing a second oxide layer 10 on the structure in FIG. 10b by a thickness between 10 nm and 300 nm from the surface.

Eventually, the height of the Fin active region 4 protruding above the second oxide layer 10 is between 5 nm and 300 nm.

Figure 10D:
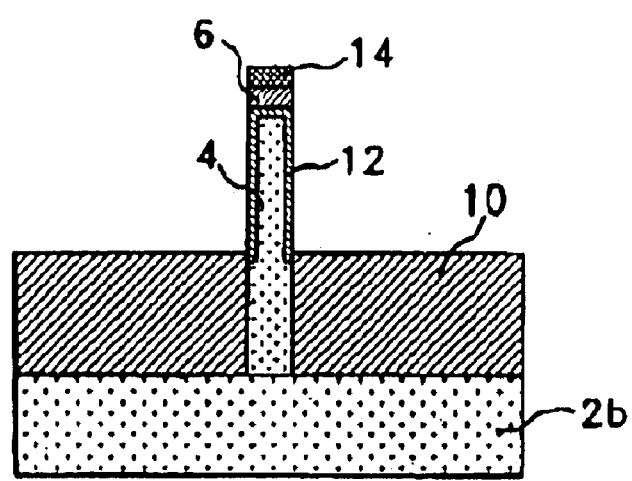

FIG. 10d shows a cross section of a gate oxide layer 12 grown with a thickness between 0.5 nm and 10 nm in the formed Fin active region 4.

Here, the gate oxide layer 12 can be formed after removing the nitride layer 14.

It is more preferable to clean the side-walls of the protruding Fin active region 4 before growing the gate oxide layer 12 and to carry out an annealing process in a Nitrogen or Argon atmosphere after removing a sacrificial oxide layer which is grown to remove the damage generated during the previous process.

As a post process, a gate electrode is formed using one of gate materials such as poly-silicon (P+ or N+ doping), SiGe (P+ or N+ doping), and metals, and the gate 16 is defined using photolithography.

An oxide layer is formed and an appropriate heat treatment process carries out, and if necessary, an oxidation layer is deposited.

Afterwards, a photolithography process is carried out for forming a contact region 46.

A metal layer 48 is deposited to be electrically connected with the source/drain and a metal wiring is formed through a photolithography process.

FIG. 11 is an example for implementing the body where the channel of a FinFET device is formed according to the present invention. It shows the essential processing steps for fabricating a Fin channel using the selective epitaxial growth method.

Figure 11A:
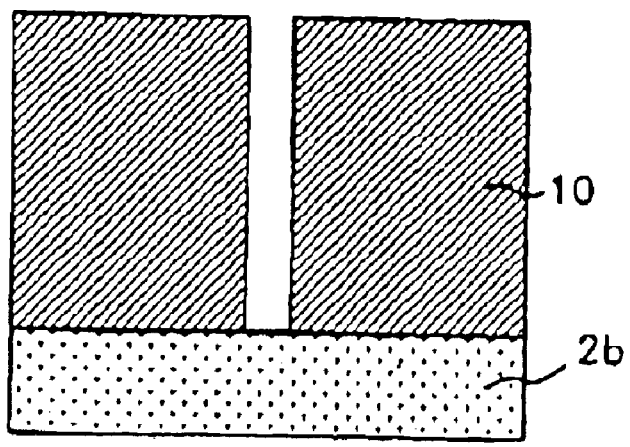
FIG. 11a through FIG. 11d show key steps to implement the body structure of the FinFET device according to the third embodiment of the present invention.

FIG. 11a shows the process of forming a second oxide layer 10 with a thickness value between 20 nm and 100 nm on a bulk silicon substrate 2b and carrying out a nano-patterning and etching the second oxide layer 10 to the deposited thickness.

Here, the width of etched second oxidation layer 10 is between 4 nm and 100 nm and the depth is between 10 nm and 1000 nm.

Taking the silicon region of the exposed bulk silicon substrate, 2b at the bottom of etched oxide layer trench, a selective epitaxial layer of a suitable height is grown in order to form a Fin active region 4 utilizing the selective epitaxial growth method.

A first oxide layer 6 is formed with a thickness between 0.5 nm to 200 nm above the Fin active region 4, and a nitride layer 14 is formed 10 nm to 200 nm above the first oxide layer 6.

Figure 11B:
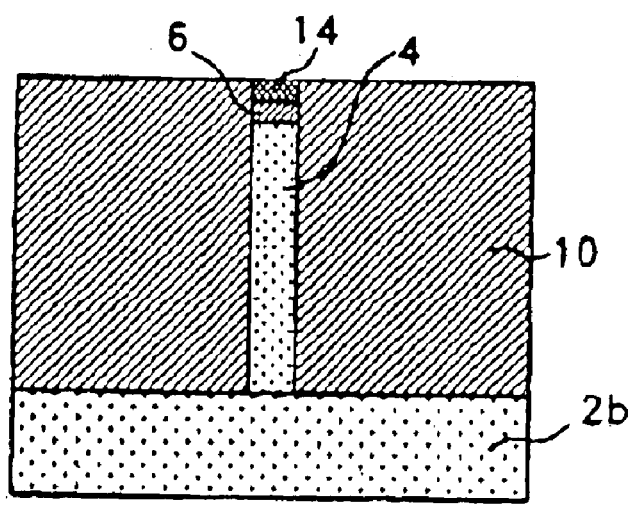

FIG. 11b shows a cross section when the first oxide layer 6 and nitride layer 14 are etched as much as the deposited thickness through CMP or dry etching.

Figure 11C:
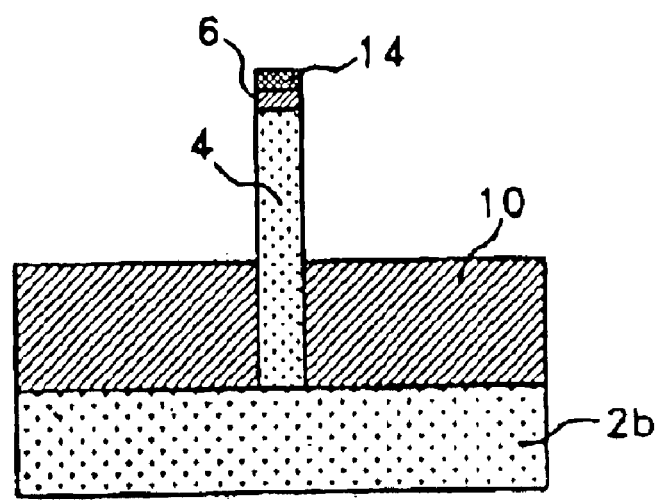

FIG. 11c shows a cross section when the second oxide layer 10 is etched by a thickness between 10 nm and 300 nm from the surface.

Eventually, the height of the Fin active region 4 protruding above the second oxide layer 10 is between 5 nm and 300 nm.

Figure 11D:
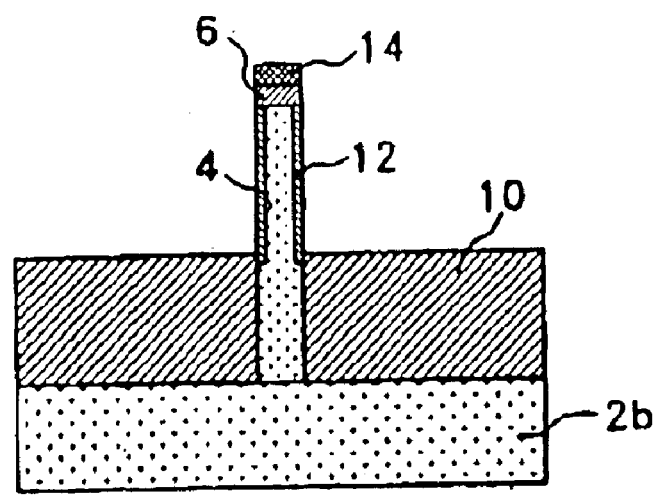

FIG. 11d shows a cross section of a gate oxide layer 12 which is grown in the formed Fin active region 4.

It is more preferable to clean the side-walls of the protruding Fin active region 4 before growing the gate oxide layer 12 and to carry out an annealing process in a Nitrogen or Argon atmosphere after removing a sacrificial oxide layer which is grown to remove the damage generated during the previous process.

The subsequent post-processing steps are identical to those of FIG. 9d and FIG. 10d.

FIG. 12 is an example for fabricating a body where the channel of the FinFET device is to be formed according to the present invention. It shows the essential processing steps for fabricating the structure by growing a field oxidation layer 28 instead of utilizing Chemical Mechanical Polishing (CMP).

Here, the essential fabrication processes are implemented by applying a spacer oxide layer 26 and the field oxide layer 28 growth technology.

Figure 12A:
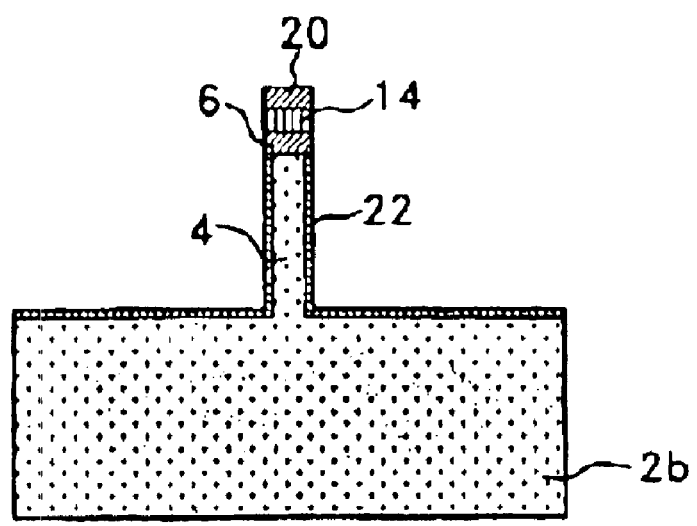
FIG. 12a through FIG. 12d show key steps to implement the body structure of the FinFET device according to the fourth embodiment of the present invention.

In FIG. 12a, a first oxide layer 6 is formed with a thickness between 0.5 nm and 200 nm after a Fin active region 4 is formed through a photolithography process, a nitride layer 14 is formed above the first oxide layer 6 with a thickness between 10 nm and 200 nm, and a third oxidation layer 20 is formed above the nitride layer 14 with a thickness between 5 nm and 500 nm.

FIG. 12a shows a cross section when the third oxidation layer 20, nitride layer 14, first oxidation layer 6 and the silicon of the bulk silicon substrate 2b are etched.

The height of the formed Fin active region should be between 10 nm and 1000 nm.

In this condition, a thin buffer oxide layer 22 is formed with a thickness between 1 nm and 50 nm and a nitride layer 24 is formed on the buffer oxide layer 22 with a thickness between 5 nm and 100 nm.

Also, when anisotropic etching is carried out after a layer of oxide is formed on the nitride layer 24 with a thickness between 5 nm and 100 nm, spacer oxide layer 26 is formed.

The top and both side surfaces of the Fin active region 4 are covered with oxide layers (6, 20, 22, 26) and nitride layers (14, 24), and the silicon of the bulk substrate 2b is exposed in other areas.

Figure 12B:
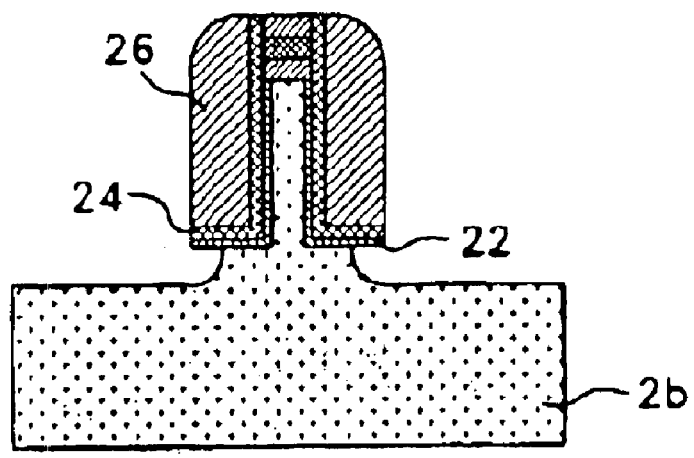

FIG. 12b shows a cross section when the silicon of the bulk substrate 2b is isotropically etched with a thickness between 30 nm and 300 nm.

Figure 12C:
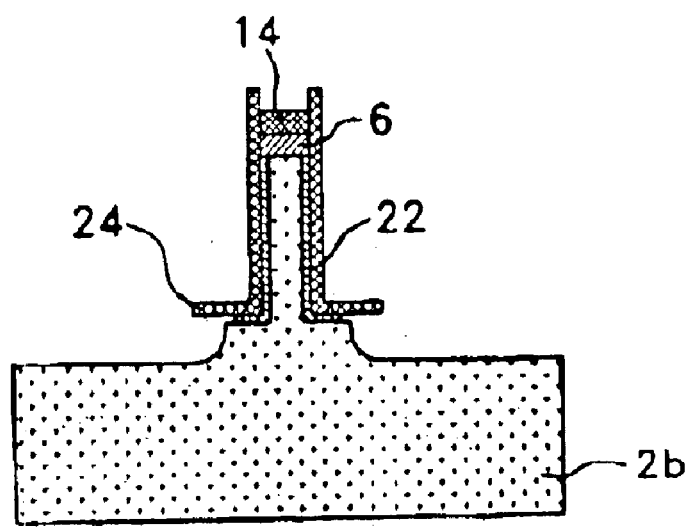

FIG. 12c shows a cross section when the oxide layers 20, 22, 26 are selectively etched.

Figure 12D:
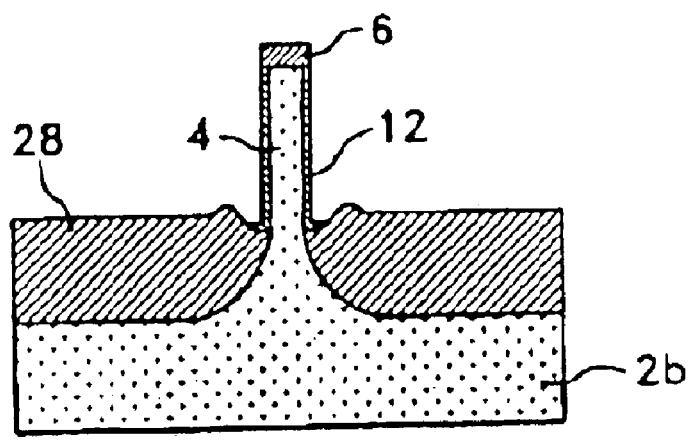

FIG. 12d shows a cross section when the nitride layers 14, 24 are removed after field oxide layer 28 is grown with a thickness between 30 nm and 500 nm.

Eventually, the height of the Fin active region 4 protruding from the field oxide layer 28 is between 5 nm and 300 nm.

FIG. 12d shows a cross section of a gate oxide layer 12 grown in the Fin active region 4.

It is more preferable to clean the side-walls of the protruding Fin active region 4 before growing the gate oxide layer 12 and to carry out an annealing process in a Nitrogen or Argon atmosphere after removing a sacrificial oxide layer which is grown to remove the damage generated during the previous process.

The subsequent post processing steps are identical to those of FIG. 9d, FIG. 10d and FIG. 11d.

FIG. 13 is an example for fabricating a body where the channel of the FinFET device is to be formed according to the present invention. It shows the essential processing steps for fabricating the structure by forming a spacer 30 and growing a field oxidation layer 28.

In comparison to FIG. 12, only the material making up the spacer 30 is different.

Figure 13A:
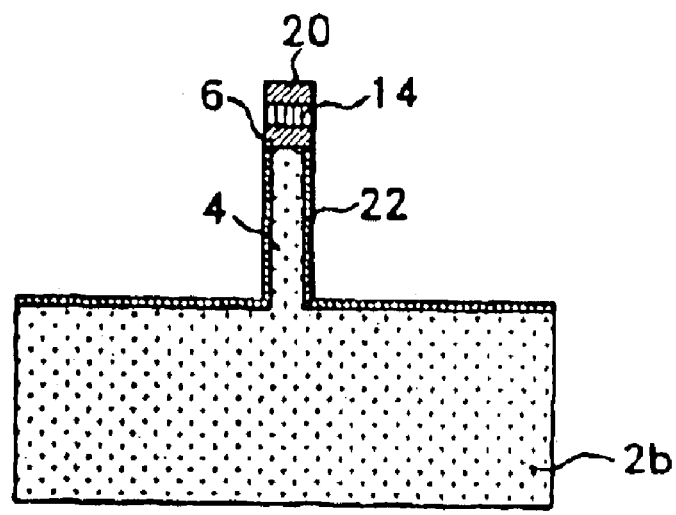
FIG. 13a through FIG. 13d show key steps to implement the body structure of the FinFET device according to the fifth embodiment of the present invention.

In FIG. 13a, a first oxide layer 6 is formed with a thickness between 0.5 nm and 200 nm after the Fin active region 4 is formed through a photolithography process, a nitride layer 14 is formed above the first oxide layer 6 with a thickness between 10 nm and 200 nm, and a third oxidation layer 20 is formed on the nitride layer 14 with a thickness between 5 nm and 500 nm.

FIG. 13a shows a cross section when the third oxide layer 20, nitride layer 14, first oxide layer 6 and the silicon of the bulk silicon substrate 2b are etched.

The height of the formed Fin active region should be between 10 nm and 1000 nm.

In this condition, a thin buffer oxide layer 22 is formed with a thickness between 1 nm and 20 nm and a nitride layer 24 is formed on the buffer oxide layer 22 with a thickness between 5 nm and 100 nm.

Also, when anisotropic etching is carried out after a poly-silicon or amorphous silicon as a spacer 30 material is formed on the nitride layer 24 with a thickness between 5 nm and 100 nm, a spacer 30 is formed.

Figure 13B:
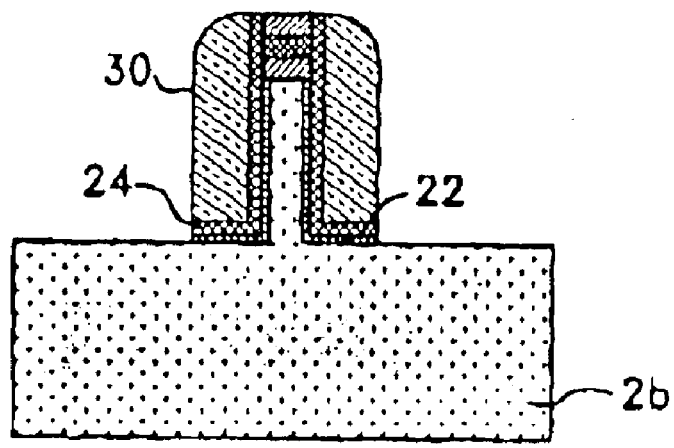
Figure 13C:
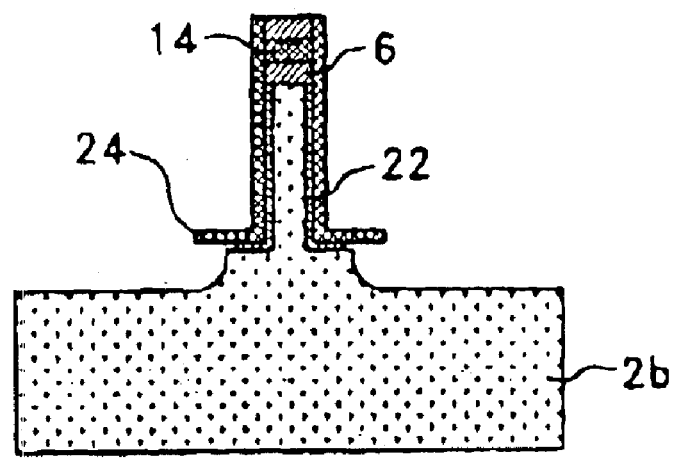
Figure 13D:
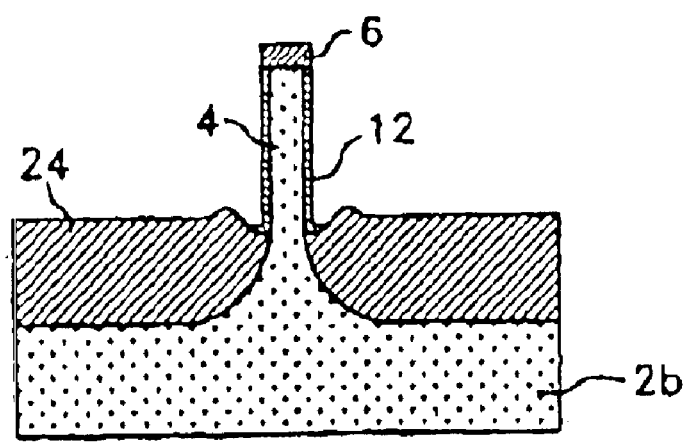

This structure is shown in FIG. 13b, and the spacer 30 in FIG. 13b and the spacer oxide layer 26 in FIG. 12b are different materials.

In FIG. 13b, poly-silicon or amorphous silicon is used for spacer materials. This is due to the fact that when the spacer oxide layer 26 is etched, a buffer oxide layer below the nitride layer 24 is etched together and might negatively affect the growth of the field oxide layer 28 later.

Also, the poly-silicon or amorphous silicon can be doped with a high concentration value.

FIG. 12b shows a cross section when the silicon of the bulk substrate 2b is isotropically etched with a thickness between 30 nm and 300 nm.

Eventually, the height of the Fin active region 4 protruding above the second oxide layer 10 is between 5 nm and 300 nm.

FIG. 12d shows a cross section of a gate oxide layer 12 grown in the formed Fin active region 4.

It is more preferable to clean the side-walls of the protruding Fin active region 4 before growing the gate oxide layer 12 and to carry out an annealing process in a nitrogen or Argon atmosphere after removing a sacrificial oxide layer which is grown to remove the damage generated during the previous process.

The subsequent post processing steps are identical to those of FIG. 9d, FIG. 10d, FIG. 11d and FIG. 12d.

As explained so far, the present invention provides a double-gate FinFET device and the method of manufacturing thereof in which a bulk wafer is utilized in order to reduce the cost, the source/drain parasitic resistance is reduced by forming a epitaxial layer which is self-aligned to gates, Fin active region which is a crystalline silicon structure act as a body on which channels are formed, and the floating body problem is resolved by being the body connected to the bulk silicon substrate.

What is claimed is:

1. A double-gate FinFET device, comprising:
   a bulk silicon substrate;
   a Fin active region which is a wall-shape single crystalline silicon on a surface of the bulk silicon substrate and connected to said bulk silicon substrate;
   a second oxide layer which is formed up to a certain height of the Fin active region from the surface of bulk silicon substrate;
   a gate oxide layer which is formed on both side-walls of the Fin active region protruded from said second oxide layer;
   a first oxide layer which is formed on the upper surface of said Fin active region with a thickness greater or equal to that of the gate oxide;
   a gate which is formed on said first and second oxide layer;
   a source/drain region which is formed on both sides of the Fin active region except where said gate overlaps with the Fin active region; and
   a contact region and a metal layer which are formed at said source/drain and gate contact region,
   wherein the thickness of said gate oxide layer is between 0.5 nm and 10 nm, and the thickness of said first oxidation layer is between 0.5 nm and 200 nm.

2. The device as claimed in claim 1, wherein the width of said Fin active region lies in a range between 4 nm and 100 nm.

3. The device as claimed in claim 1, wherein the height of said Fin active region from the surface of said bulk silicon substrate lies in a range between 10 nm and 1000 nm.

4. The device as claimed in claim 3, wherein the height of said Fin active region from the surface of said second oxide layer is between 5 nm and 300 nm.

5. The device as claimed in claim 1, wherein the parasitic capacitance between said gate and bulk silicon substrate is reduced by selecting the thickness of said second oxidation layer to be between 20 nm and 800 nm.

6. The device as claimed in claim 1, wherein the contact resistance is reduced by selecting the size of a contact region which is in contact with said metal layer to be greater than the width of said Fin active region and/or the length of said gate.

7. A double-gate FinFET device, comprising:
   a bulk silicon substrate;
   a Fin active region which is a all-shape single crystalline sililcon on a surface of the bulk silicon substrate and connected to said bulk silicon substrate;
   a second oxide layer which is formed up to a certain height of the Fin active region from the surface of bulk silicon substrate;
   a gate oxide layer which is formed on both side-walls of the Fin active region protruded from said second oxide layer;
   a first oxide layer which is formed on the upper surface or said Fin active region with a thickness greater or equal to that of the gate oxide;
   a gate which is formed on said first and second oxide layer;
   a source/drain region whcih is formed on both sides of the Fin active region except where said gate overlaps with the Fin active region; and
   a contact region and a metal layer which are formed at said source/drain and gate contact region, wherein the contact resistance is reduced by selecting the size of a contact region which is in contact with said metal layer to be greater than the width of said Fin active region, and/or the length of said gate, and selective epitaxial layer is grown on both sides (source/drain region) of the Fin active region except where said Fin active region overlaps with the gate in a self-aligned manner to the gate, in order to reduce parasitic source/drain resistance.

8. The device as claimed in claim 7, wherein said selective epitaxial layer is grown by oxidizing said gate doped with the doping concentration value above $10^{20}$ cm$^{-3}$ in wet ambient, and etching some parts of the grown oxide layer using the fact that the gate oxidation rate is greater than the Fin active region, and taking the silicon which is exposed on both side-walls of the Fin active region as a seed.

9. The device as claimed in claim 7, wherein said selective epitaxial layer is grown by depositing a dielectric layer, and anisotropically etching as much as the thickness of the dielectric layer and the height of the Fin active region protruding above the second oxide layer, and taking the silicon which is exposed at side-walls of the Fin active region except the vicinity where the Fin active region and gate meets and a poly-silicon gate, as seeds.

10. The device as in any one of claims 7, wherein the material for said selective epitaxial layer is selected from the group consisting of a single crystalline silicon, single crystalline SiGe, single crystalline Ge, poly-silicon, and poly SiGe.

11. The device as claimed in claim 1, wherein said doping junction depth for the source/drain formed in said Fin active region, when the upper surface of said second oxide layer is taken as a reference level (0 nm), is around 0 nm to 50 nm above the reference level.

12. The device as claimed in claim 1, wherein said doping junction depth for the source/drain formed in said Fin active region, when the upper surface of said second oxide layer is taken as a reference level (0 nm), is around 0 nm to −50 nm below the reference level.

13. A double-gate FinFET device, comprising:
a bulk silicon substrate;
a Fin active region which is a all-shape single crystalline sililcon on a surface of the bulk silicon substrate and connected to said bulk silicon substrate;
a second oxide layer which is formed up to a certain height of the Fin active region from the surface of bulk silicon substrate;
a gate oxide layer which is formed on both side-walls of the Fin active region protruded from said second oxide layer;
a first oxide layer which is formed on the upper surface or said Fin active region with a thickness greater or equal to that of the gate oxide;
a gate which is formed on said first and second oxide layer;
a source/drain region whcih is formed on both sides of the Fin active region except where said gate overlaps with the Fin active region; and
a contact region and a metal layer which are formed at said source/drain and gate contact region,
wherein the resistance of said Fin active region is reduced by enlarging the width of said Fin active region within the oxidation layer as it approaches the bulk silicon substrate.

14. The device as claimed in claim 1, wherein the shape of said Fin active region is a trapezoid where the width of the upper section is narrow and the lower section is wide.

15. The device as claimed in claim 1, wherein the two top corners of said Fin active region are chamfered through an oxidation and etching, or (and) annealing process in a hydrogen atmosphere.

16. The device as claimed in claim 2, wherein the height of said Fin active region from the surface of said bulk silicon substrate lies in a range between 10 nm and 1000 nm.

17. The device as claimed in claim 16, wherein the height of said Fin active region from the surface of said second oxide layer is between 5 nm and 300 nm.

18. The device as claimed in claim 8, wherein the material for said selective epitaxial layer is selected from the group consisting of a single crystalline silicon, single crystalline SiGe, single crystalline Ge, poly-silicon, and poly SiGe.

19. The device as claimed in claim 9, wherein the material for said selective epitaxial layer is selected from the group consisting of a single crystalline silicon, single crystalline SiGe, single crystalline Ge, poly-silicon, and poly SiGe.

* * * * *